United States Patent
Zihir et al.

(10) Patent No.: US 10,483,653 B2
(45) Date of Patent: *Nov. 19, 2019

(54) FAST MEMORY ACCESS CONTROL FOR PHASE AND GAIN

(71) Applicant: Integrated Device Technology, Inc., San Jose, CA (US)

(72) Inventors: Samet Zihir, San Diego, CA (US); Tumay Kanar, San Diego, CA (US); Naveen Krishna Yanduru, San Diego, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/100,408

(22) Filed: Aug. 10, 2018

(65) Prior Publication Data

US 2019/0089399 A1 Mar. 21, 2019

Related U.S. Application Data

(63) Continuation of application No. 15/817,909, filed on Nov. 20, 2017, now Pat. No. 10,063,303.
(Continued)

(51) Int. Cl.
*H04B 7/06* (2006.01)
*H01Q 21/00* (2006.01)
(Continued)

(52) U.S. Cl.
CPC ....... *H01Q 21/0006* (2013.01); *H01Q 1/2283* (2013.01); *H01Q 1/48* (2013.01); *H01Q 1/523* (2013.01); *H01Q 1/526* (2013.01); *H01Q 3/28* (2013.01); *H01Q 3/36* (2013.01); *H01Q 19/30* (2013.01); *H01Q 21/0025* (2013.01); *H01Q 21/062* (2013.01); *H01Q 21/065* (2013.01); *H03F 1/0211* (2013.01); *H03F 1/0261* (2013.01); *H03F 1/3282* (2013.01); *H03F 1/565* (2013.01); *H03F 3/19* (2013.01); *H03F 3/195* (2013.01); *H03F 3/245* (2013.01); *H03F 3/45089* (2013.01); *H03F 3/45475* (2013.01); *H03F 3/68* (2013.01); *H03G 3/3042* (2013.01); *H03H 7/487* (2013.01); *H03K 21/10* (2013.01);
(Continued)

(58) Field of Classification Search
CPC .............................. H04B 7/0617; H03K 21/10
USPC .......................... 375/295, 298, 299; 343/763
See application file for complete search history.

(56) References Cited

U.S. PATENT DOCUMENTS 6,157,681 A   12/2000  Daniel ........................ 375/298
7,366,029 B2   4/2008  Kagan ..................... 365/185.11
(Continued)

*Primary Examiner* — Shuwang Liu
*Assistant Examiner* — Fitwi Y Hailegiorgis
(74) *Attorney, Agent, or Firm* — Christopher P. Maiorana, PC

(57) ABSTRACT

An apparatus includes a switching circuit and a plurality of registers. The switching circuit may be configured to generate a sequence of pulses in a plurality of control signals in response to a plurality of cycles of an enable signal. The registers may be hardwired as a plurality of subsets. Each of the subsets of the registers may be configured to (a) buffer a plurality of setting values received from a memory and (b) present the setting values from the registers to a plurality of transceiver circuits while a corresponding one of the control signals is in an active state. The transceiver circuits may be updated with the setting values from the registers within a predetermined time.

20 Claims, 8 Drawing Sheets

Related U.S. Application Data

(60) Provisional application No. 62/559,875, filed on Sep. 18, 2017, provisional application No. 62/560,173, filed on Sep. 18, 2017.

(51) Int. Cl.

| | |
|---|---|
| *H04B 1/44* | (2006.01) |
| *H03F 1/56* | (2006.01) |
| *H03F 3/19* | (2006.01) |
| *H03G 3/30* | (2006.01) |
| *H03F 3/24* | (2006.01) |
| *H03K 21/10* | (2006.01) |
| *H04B 1/04* | (2006.01) |
| *H04B 1/18* | (2006.01) |
| *H04B 1/48* | (2006.01) |
| *H01Q 1/52* | (2006.01) |
| *H01Q 3/28* | (2006.01) |
| *H01Q 3/36* | (2006.01) |
| *H01Q 19/30* | (2006.01) |
| *H01Q 21/06* | (2006.01) |
| *H03F 1/02* | (2006.01) |
| *H01Q 1/48* | (2006.01) |
| *H01Q 1/22* | (2006.01) |
| *H03H 7/48* | (2006.01) |
| *H04B 1/401* | (2015.01) |
| *H03F 1/32* | (2006.01) |
| *H03F 3/195* | (2006.01) |
| *H03F 3/45* | (2006.01) |
| *H03F 3/68* | (2006.01) |

(52) U.S. Cl.
CPC ............ *H04B 1/0458* (2013.01); *H04B 1/18* (2013.01); *H04B 1/401* (2013.01); *H04B 1/44* (2013.01); *H04B 1/48* (2013.01); *H04B 7/0617* (2013.01); *H03F 2200/294* (2013.01); *H03F 2200/387* (2013.01); *H03F 2200/451* (2013.01)

(56) References Cited

U.S. PATENT DOCUMENTS

| | | | |
|---|---|---|---|
| 2003/0142989 A1 | 7/2003 | Kobayashi | 399/75 |
| 2007/0057858 A1 | 3/2007 | Lockie | 343/763 |
| 2007/0247934 A1 | 10/2007 | Kagan | 365/193 |
| 2014/0210668 A1 | 7/2014 | Wang et al. | |
| 2017/0229009 A1 | 8/2017 | Foster | |

# FAST MEMORY ACCESS CONTROL FOR PHASE AND GAIN

This application relates to U.S. Ser. No. 15/817,909, filed Nov. 20, 2017, which claims the benefit of U.S. Provisional Application No. 62/559,875, filed Sep. 18, 2017, and U.S. Provisional Application No. 62/560,173, filed Sep. 18, 2017, which are hereby incorporated by reference in their entirety.

FIELD OF THE INVENTION

The invention relates to radio frequency control generally and, more particularly, to a method and/or apparatus for implementing fast memory access control for phase and gain.

BACKGROUND

Conventional wireless communications systems that utilize steerable beams can communicate with multiple wireless nodes by moving the beams from one wireless node to the next. A single beam may service two or three wireless nodes in a sequence and repeat the sequence periodically such that each wireless node appears to be in constant communications with the system. However, the beam steering can take a significant amount of time for new settings to be determined and loaded into the appropriate circuitry to adjust the beams. The delay in changing the settings typically limits the number of wireless nodes that any single beam can service while maintaining a specified quality of service.

It would be desirable to implement fast memory access control for phase and gain.

SUMMARY

The invention concerns an apparatus including a switching circuit and a plurality of registers. The switching circuit may be configured to generate a sequence of pulses in a plurality of control signals in response to a plurality of cycles of an enable signal. The registers may be hardwired as a plurality of subsets. Each of the subsets of the registers may be configured to (a) buffer a plurality of setting values received from a memory and (b) present the setting values from the registers to a plurality of transceiver circuits while a corresponding one of the control signals is in an active state. The transceiver circuits may be updated with the setting values from the registers within a predetermined time.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing fast memory access control for phase and gain that may (i) provide fast beam steering, (ii) utilize pre-loaded lookup tables to enable the beam steering, (iii) achieve long range communication delivering very high capacity, (iv) be used in high data rate communications links, (v) be implemented as part of a 5G wireless communications network and/or (vi) be implemented as one or more integrated circuits.

Embodiments of the invention generally provide a technique to provide fast memory access control of buffers that store setting values. The setting values may be used to control a beam pattern generated by an antenna array. The buffers are generally arranged in parallel subsets (or levels). The subsets are accessed in a time-shared sequence, one subset at a time. The setting values in a currently selected (or active) subset may be transferred to and used by multiple transceiver channel circuits. The transceiver channel circuits may be configured by the current setting values to modify the gains and phases of radio frequency signals passing through the transceiver channel circuits. The gain values and the phase values generally establish various geometries, lobes and/or patterns in the beam created by the antenna array. By arranging the buffers as parallel subsets, and hardwiring the output ports of the buffers together, fast changes may be made to the current setting values thereby resulting in fast switching of the beam pattern.

Figure 1:
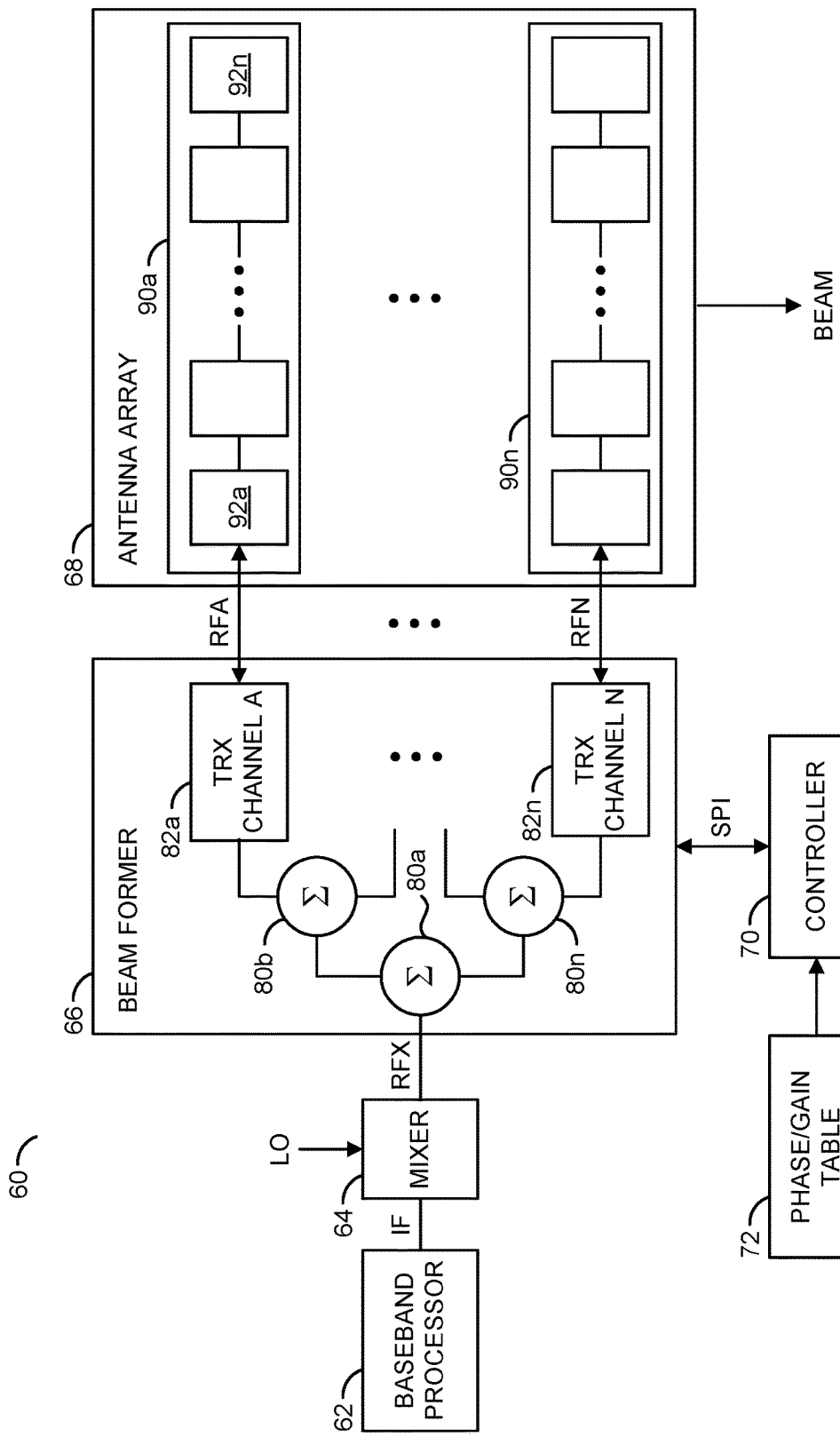
FIG. 1 is a block diagram of a system illustrating a context of the invention.

Referring to FIG. 1, a block diagram of a system 60 illustrating a context of the invention is shown. The system (or module or circuit or apparatus) 60 may implement a radio frequency (RF) transceiver system in accordance with an example embodiment of the invention. The RF transceiver system 60 may be configured to operate at common wireless radio frequencies, millimeter-wave frequencies, and/or microwave frequencies. In various embodiments, the RF transceiver system 60 may form part of a long range communications link. In various embodiments, the long range communications link may be part of a fifth generation (5G) wireless communications system (e.g., for which a standard is currently under development by the Next Generation Mobile Networks (NGMN) Alliance). In other embodiments, the long range communications link may be part of a fourth generation (4G) wireless communications system (e.g., International Mobile Telecommunications-Advanced (IMT-A) standard published by the International Telecommunications Unit Radiocommunication Sector (ITU-R)). However, other communications standards may be implemented to meet the design criteria of a particular application.

The RF transceiver system 60 may include configurable multilayer fast-memory access registers (e.g., hardwired switches) to facilitate rapid beam steering. The rapid beam steering may involve loading pre-stored phase settings and/ or gain settings from a selected register layer into all of the transceiver channel circuits in a short period. Many register layers may be included to steer the beam to many different wireless devices in quick order.

The RF transceiver system 60 generally comprises a block (or circuit) 62, a block (or circuit) 64, a block (or circuit) 66, a block (or circuit) 68, a block (or circuit) 70 and a block (or circuit) 72. The circuit 66 generally comprises multiple blocks (or circuits) 80a-80n and multiple blocks (or circuits) 82a-82n. The circuit 68 generally comprises multiple blocks (or circuits) 90a-90n. Each circuit 90a-90n may comprise multiple blocks (or circuits) 92a-92n. The circuits 62-92n may be implemented with hardware, a combination of hardware and software and/or simulated with software.

A signal (e.g., IF) may be exchanged between the circuit 62 and the circuit 64. The signal IF may implement an intermediate frequency signal carrying information to be transmitted from and/or received by the RF transceiver system 60. A signal (e.g., LO) may be received by the circuit 64. The signal LO may implement a local oscillator signal. A signal (e.g., RFX) may be exchanged between the circuit 64 and the circuit 80a within the circuit 66. The signal RFX may be a radio frequency signal that conveys the information also found in the intermediate signal IF. Multiple signals (e.g., RFA to RFN) may be exchanged between the circuits 82a-82n and the circuits 90a-90n. Each signal RFA to RFN may implement a radio frequency signal. In a transmit mode, the radio frequency signals RFA to RFN may be high power signals used to broadcast the information from the circuit 68. In a receive mode, the radio frequency signals RFA to RFN may be low power signals received by the circuit 68. A field (e.g., BEAM) may be generated by the circuit 68. The field BEAM may represent a field pattern (or radio frequency beam pattern) created by the circuits 90a-90n, respectively. A signal (e.g., SPI) may be exchanged between the circuit 66 and the circuit 70. The signal SPI may convey data, clocking and control elements.

The circuit 62 may implement a baseband processor circuit. The baseband processor circuit 62 is generally operational to process the information sent by and/or received in the intermediate signal IF. The processing may include, but is not limited to, modulation/demodulation of the radio signal that contains the information and management of simultaneous communications between the RF transceiver system 60 and multiple remote terminals.

The circuit 64 may implement a mixer circuit. The mixer 64 is generally operational to frequency convert between an intermediate frequency used for the intermediate signal IF and the radio frequency used for the signal RFX. The frequency conversion may be based on a local oscillator frequency of the local oscillator signal LO. In various embodiments, the common radio frequency signal RFX may be in a range of frequencies centered around approximately 28 gigahertz (GHz) or 39 GHz (e.g., 24 GHz to 30 GHz or 37 GHz to 44 GHz). The intermediate frequency may cover a band from approximately 2 GHz to 6 GHz (e.g., an approximately 4 GHz bandwidth). The local oscillator frequency may range from approximately 22 GHz to 26 GHz while the signal RFX is at 28 GHz. The local oscillator frequency may range from approximately 33 GHz to 37 GHz while the signal RFX is at 39 GHz. Other frequency ranges may be implemented to meet the design criteria of a particular application.

The circuit 66 may implement a beam former circuit. The beam former circuit 66 is generally operational to multiplex/demultiplex the common signal RFX with multiple (e.g., N) transceiver channel circuits. The beam former circuit 66 may also be operational to change setting values rapidly (e.g., phase values and gain values) used by the transceiver channel circuits to steer the field BEAM formed by the circuit 68. In various embodiments, the beam former circuit 66 may be implemented as one or more integrated circuits.

The circuit 68 may implement an antenna array. The antenna array 68 may be operational to transmit and receive wireless signals to and from devices (or terminals) remotely located from the RF transceiver system 60. Sensitivity to the wireless signals may be determined by the field BEAM created by the antenna array 68. The antenna array 68 may comprise a number (e.g., N) of the circuits 90a-90n. The N transceiver channel circuits of the beam former circuit 66 may be coupled by the corresponding bidirectional signals RFA to RFN to the N circuits 90a-90n. In various embodiments, the antenna array 68 may be implemented as a patch antenna or a phased array antenna.

The circuit 70 may implement a controller circuit. The controller 70 is generally operational to control the operations of the beam former circuit 66. In some embodiments, the controller 70 may determine the setting values used in each transceiver channel within the beam former circuit 66 to establish the geometry of the field BEAM. In various embodiments, the controller 70 may be implemented as one or more integrated circuits.

The circuit 72 may implement a table in a memory circuit. The table 72 may be configured to store multiple gain values and multiple phase values used by the transceiver channel circuits in the beam former circuit 66 to establish the field BEAM. The phase values and the gain values may be loaded from the table 72 into buffers within the beam former circuit 66 by the controller 70. In various embodiments, the memory storing the table 72 may be implemented on the same integrated circuit as the controller 70.

Each circuit 80a-80n may implement a combiner circuit. In various embodiments, each combiner circuit 80a-80n may be implemented as a Wilkinson combiner circuit. In the transmit mode, the combiner circuits 80a-80n are generally operational to distribute the power in the common signal RFX to the circuits 82a-82n in the beam former circuit 66. In the receive mode, the combiner circuits 80a-80n may be operational to combine the power received in signals from the circuits 82a-82n into the common signal RFX.

Each circuit 82a-82n may implement a transceiver (TRX) channel circuit. In the transmit mode, the transceiver channel circuits 82a-82n are generally operational to amplify the signals received from a corresponding combiner circuit 80a-80n to generate a respective radio frequency signal RFA to RFN. In the receive mode, the transceiver channel circuits 82a-82n may be operational to amplify the radio frequency signals RFA to RFN and present the amplified signals back to the combiner circuits 80a-80n. The phase values and the gain values used by the transceiver channel circuits 82a-82n may be loaded from the table 72 via the controller 70.

Each circuit 90a-90n may implement a fed antenna array. In the transmit mode, the fed antenna arrays 90a-90n are generally operational to transmit the radio frequency signals RFA to RFN to the remote devices. The transmissions may be directional within the field BEAM, as determined by the setting values used at the time. Each fed antenna array 90a-90n generally comprises multiple circuits 92a-92n. Each fed antenna array 90a-90n may be switchable among the N fed channels 82a-82n of the beam former circuit 66 to send and receive the signals in the transmit mode and the receive mode.

Each circuit 92a-92n may implement an antenna element. The antenna elements 92a-92n in each fed antenna array 90a-90n may be used for both transmission and reception. In various embodiments, each antenna element 92a-92n may be implemented as a microstrip antenna. A physical positioning of the antenna elements 92*a*-92*n* generally provides a two-dimensional (e.g., horizontal and vertical as illustrated) control of the field BEAM.

Figure 2:
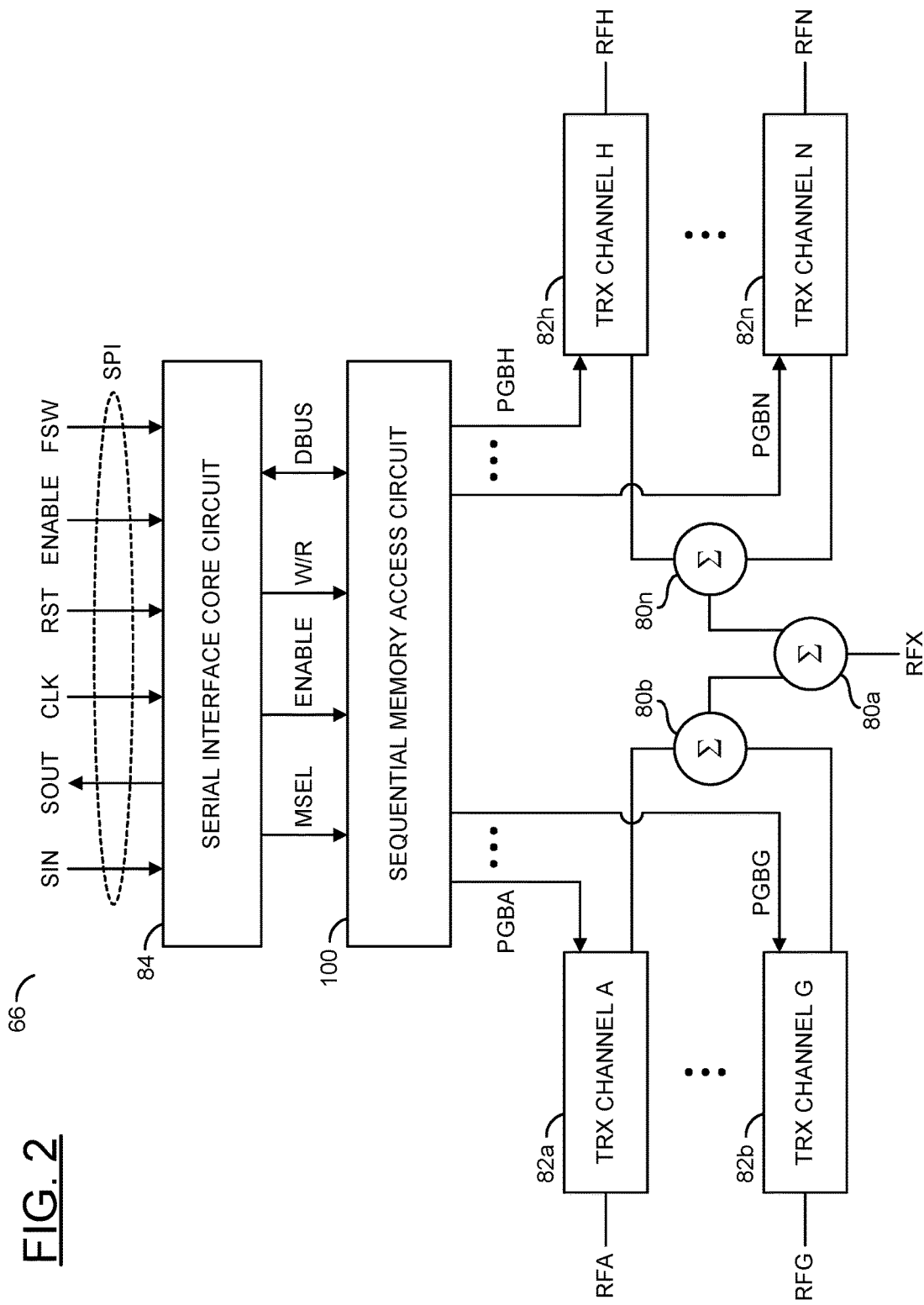
FIG. 2 is a block diagram of a beam former circuit in accordance with an embodiment of the invention.

Referring to FIG. 2, a block diagram of an example implementation of the beam former circuit 66 in accordance with an embodiment of the invention is shown. The beam former circuit 66 generally comprises the combiner circuits 80*a*-80*n*, the transceiver circuits 82*a*-82*n*, a block (or circuit) 84 and a block (or circuit) 100. The circuits 84-100 may be implemented with hardware, a combination of hardware and software and/or simulated with software.

The signal SPI may comprise multiple signals (e.g., SIN, SOUT, CLK, RST, ENABLE and FSW). The signal SIN may be received by the circuit 84. The signal SIN may be a serial input signal used to convey data and commands from the controller 70 to the beam former circuit 66. The signal SOUT may be generated by the circuit 84. The signal SOUT may be a serial output signal used to convey data and results from the beam former circuit 66 to the controller 70. The circuit 84 may receive the signal CLK. The signal CLK may implement a clock signal used to synchronize data bits in the serial input signal SIN. The signal RST may be received by the circuit 84. The signal RST may implement a reset signal used to reset the circuit 84 before a new stream of data is transferred. The signal ENABLE may be received by the circuit 84 and transferred to the circuit 100. The signal ENABLE may be an enable signal synchronized to the clock signal CLK. The circuit 84 may receive the signal FSW. The signal FSW may be a fast switch signal used to command the beam former circuit 66 alternatively into the transmit mode and the receive mode.

A signal (e.g., MSEL) may be generated by the circuit 84 and received by the circuit 100. The signal MSEL may be a mode select signal that alternately enables and disables a fast phase/gain switching function of the beam former 66. The signal ENABLE may be transferred from the controller 70 through the circuit 84 to the circuit 100. The circuit 84 may generate a signal (e.g., W/R) received by the circuit 100. The signal W/R may be a write/read signal. While in a write state, the signal W/R may indicate a write of gain values, phase values and/or bias values into buffers within the circuit 100. While in a read state, the signal W/R may indicate a read of the gain values, the phase values and/or the bias values from the circuit 100. A signal (e.g., DBUS) may be exchanged between the circuit 84 and the circuit 100. The signal DBUS may be a bidirectional data bus signal used to transfer the various values between the circuits 84 and 100 along a local data bus. Multiple signals (e.g., PGBA to PGBN) may be generated by the circuit 100 and transferred to the transceiver channel circuits 82*a*-82*n*, respectively. Each signal PGBA to PGBN may carry a current phase value (P), a current gain value (G) and a current bias value (B) to be used by the corresponding transceiver channel circuits 82*a*-82*n*.

The circuit 84 may implement a serial protocol interface (SPI) core circuit. The SPI core circuit 84 may be operational to provide communications between the beam former circuit 66 and the controller 70 via the signals SIN, SOUT, CLK, RST, ENABLE and FSW. In various embodiments, the SPI core circuit 84 may control the setting values (e.g., the gain values and the phase values) and/or the bias values buffered in the circuit 100. The setting values may provide several tens (e.g., 35) of decibels (dB) of gain control for the field BEAM. The setting values may also provide multiple bits (e.g., 5 bits) of phase control for the field BEAM. Other gain ranges and/or phase ranges may be implemented to meet the design criteria of a particular application. Loading of the setting values into the buffers within the circuit 100 is generally controlled by the mode select signal MSEL and the enable signal ENABLE. A topology of the system 60 generally utilizes a single pad for the signal ENABLE at the SPI core circuit 84 to control sequential access to the register layers. The single pad approach generally reduces a number of pads compared with common multi-pad designs that implement random access addressing for the registers.

The SPI core circuit 84 may also be operational to control the transmit/receive mode of the transceiver circuits 82*a*-82*n* using the fast switching signal FSW. A switching speed from the transmit mode to the receive mode may be fast (e.g., less than 50 nanoseconds). A switching speed from the receive mode to the transmit mode may be similarly fast. The fast switching signal FSW may be toggled between the transmit mode and the receive mode at a high frequency (e.g., at least 10 megahertz). Other frequencies of the fast switching signal FSW may be implemented to meet the design criteria of a particular application.

The circuit 100 may implement a sequential memory access circuit (or access circuit for short). The access circuit 100 is generally operational to buffer multiple subsets (or layers) of the gain values, the phase values and the bias values for each of the transceiver channel circuits 82*a*-82*n*. In various embodiments, the number of subsets may be an integer N (e.g., an integer ranging from 4 to at least 128) to provide fast beam redirecting to N remote devices in short order. Other numbers of subsets may be implemented to meet the design criteria of a particular application.

While the mode select signal MSEL is in the enable state, when the signal ENABLE changes from a hold state (or mode) to a transfer state (or mode), the access circuit 100 may be operational to switch to a next subset of the gain values and the phase values thereby causing the field BEAM to be directed among different remote devices. The switching of the subsets may be triggered by an edge in the signal ENABLE transitioning to the transfer state, or a level of the signal ENABLE being in the transfer state.

Each load operation of a new subset of the gain values and the phase values into the transceiver channel circuits 82*a*-82*n* generally causes the field BEAM to adjust to a new location. The new subset may also cause adjustments of the beam geometry. The adjustments are generally achieved within a short period (e.g., under 30 nanoseconds) to meet a low-latency criterion. Once the current beam field BEAM has been adjusted, the RF transceiver station 60 may communicate bidirectionally with a remote wireless device generally aligned with at least one lobe in the field BEAM. The communication is typically achieved during a burst lasting a specified dwell period (e.g., approximately one microsecond). After the dwell period has ended, a next subset of the gain values and the phase values may be loaded into the transceiver channel circuits 82*a*-82*n* to cause more adjustments of the beam location and/or geometry. The next beam location and/or geometry may be suitable for bidirectional communications with a next remote wireless device. Afterwards, the RF transceiver system 60 may communicate bidirectionally with the next remote wireless device for another predetermined dwell period. Other switching speeds and/or lengths of the predetermined period may be implemented to meet the design criteria of a particular application.

While the mode select signal MSEL is in the disable state, the access circuit 100 may configure a first of multiple register control signals to follow the signal ENABLE. The other register control signals may be deasserted. The pulses in the first register control signal that follow the pulses in the signal ENABLE may be used by a first register layer of the access circuit 100 to load the gain values, the phase values and/or the bias values presented by the SPI core circuit 84.

Figure 3:
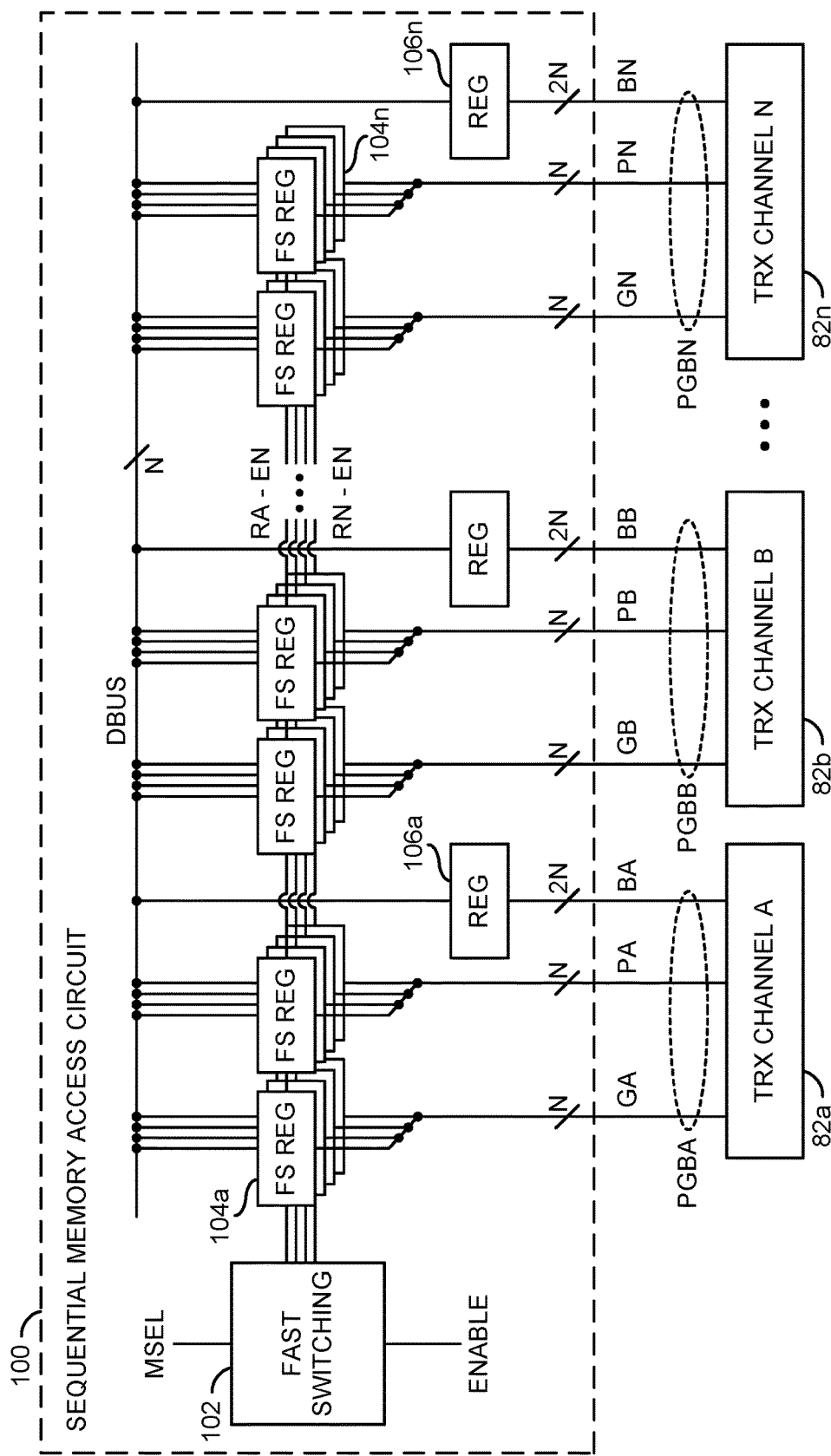
FIG. 3 is a block diagram of a sequential memory access circuit in the beam former circuit of FIG. 2 in accordance with an embodiment of the invention.

Referring to FIG. 3, a block diagram of an example implementation of the access circuit 100 is shown in accordance with an embodiment of the invention. The access circuit 100 generally comprises a block (or circuit) 102, multiple blocks (or circuits) 104a-104n and multiple blocks (or circuits) 106a-106n. The circuits 102-106n may be implemented with hardware, a combination of hardware and software and/or simulated with software.

The mode select signal MSEL may be received by the circuit 102. The circuit 102 may also receive the signal ENABLE. Multiple signals (e.g., RA-EN to RN-EN) may be generated by the circuit 102 and presented to the circuits 104a-104n. The signals RA-EN to RN-EN may implement the register control signals. The bidirectional data bus signal DBUS may be exchanged between the SPI core circuit 84 and the circuits 104a-104n. In some embodiments, data values in the data bus signal DBUS may implement N-bit (e.g., 8-bit or 16-bit) data values. Multiple signals (e.g., GA to GN) may be presented by some of the circuits 104a-104n to the corresponding transceiver channel circuits 82a-82n. Each signal GA to GN may convey a gain value. In various embodiments, the gain values may be N-bit (e.g., 8-bit or 16-bit) values. Multiple signals (e.g., PA to PN) may be presented by some of the circuits 104a-104n to the corresponding transceiver channel circuits 82a-82n. Each signal PA to PN may convey a phase value. The phase values may also be N-bit (e.g., 8-bit or 16-bit) values. Multiple signals (e.g., BA to BN) may be presented by the circuits 106a-106n to the corresponding transceiver channel circuits 82a-82n. Each signal BA to BN may carry a bias value used to trim the transceiver channel circuits 82a-82n. In some embodiments, the bias values in the signals BA to BN may be 2N-bit (e.g., 16-bit or 32-bit) values. The circuit 102 may implement a fast switching circuit.

The fast switching circuit 102 is generally operational to generate a sequence of pulses in the register control signals RA-EN to RN-EN in response to the signal ENABLE and the mode select signal MSEL. The mode select signal MSEL may be in either the enabled state (e.g., a high voltage or a logical one state) or the disable state (e.g., a low voltage or a logical zero state). The enable signal ENABLE may be in either the hold state (or mode) or the transfer state (or mode).

While the mode select signal MSEL is in the enabled state and the signal ENABLE is in, or transitions to, the hold state, the fast switching circuit 102 may deassert all register control signals RA-EN to RN-EN. The circuits 104a-104n may respond to the deasserted register control signals RA-EN to RN-EN by presenting high-impedance states (or conditions) at the buffer output ports (or nodes).

While the mode select signal MSEL is in the enable state and the signal ENABLE is in, or transitions to, the transfer state, the fast switching circuit 102 may be configured to assert one of the register control signals RA-EN to RN-EN at a time. The other register control signals RA-EN to RN-EN may remain deasserted. In various embodiments, the assertions are non-overlapping. Each asserted register control signal RA-EN to RN-EN generally causes the corresponding subset of the circuits 104a-104n to present the buffered gain values and the buffered phase values at the output ports to the transceiver channel circuits 82a-82n. The transceiver channel circuits 82a-82n may use the buffered phase value and the buffered gain values to control the amplitude and relative phases of the radio frequency signals RFA to RFN thereby steering and/or altering the geometry of the field BEAM.

While the mode select signal MSEL is in the disable state, the fast switching circuit 102 may configure the register control signal RA-EN to follow the signal ENABLE. The register control signals RB-EN to RN-EN may be deasserted. The pulses in the register control signal RA-EN that follow the pulses in the signal ENABLE may be used by a first subset of the circuits 104a-104n and 106a-106n to load the gain values, the phase values and the bias values received from the SPI core circuit 84.

Each circuit 104a-104n may implement a register circuit. Each register 104a-104n is generally operational to buffer an individual gain value or an individual phase value for a corresponding transceiver circuit 82a-82n. The output ports of the registers 104a-104n may be directly connected to input ports (or nodes) of the transceiver channel circuits 82a-82n. In various embodiments, the registers 104a-104n may be configured to hold the N-bit (e.g., 8-bit) values received from and transferred in the signals DBUS, GA to GN and PA to PN. Other storage bit widths may be implemented to meet the design criteria of a particular application.

The registers 104a-104n may be grouped together to form the N subsets (or layers). Each register 104a-104n within a subset may be controlled by a corresponding register control signal RA-EN to RN-EN. While the corresponding register control signal RA-EN is active, all registers 104a-104n within the subset may drive the buffered values through the gain signals GA to GN and the phase signals PA to PN to the corresponding input ports of the transceiver channel circuits 82a-82n. While the corresponding register control signal RA-EN is inactive, all registers 104a-104n within the subset may present a high-impedance state (or condition) at the output nodes. As such, all register 104a-104n that drive the gain signal GA may be hardwired together as a Boolean OR. A similar Boolean OR may be created for each gain signal GB to GN and each phase signal PA to PN.

In operation, a single signal RA-EN to RN-EN may be in the active state at any moment so that each gain signal GA to GN and each phase signal PA to PN is determined by a single register 104a-104n. When the active signal among the register control signals RA-EN to RN-EN changes, the active registers 104a-104n may change causing different gain values and phase values to be presented to the transceiver channel circuits 82a-82n. A time from the changing the active signal among the register control signals RA-EN to RN-EN until the field BEAM is shifted (or adjusted) may be short (e.g., less than 30 nanoseconds).

The circuits 106a-106n may implement register circuits. The registers 106a-106n are generally operational to buffer bias values for the corresponding transceiver channel circuits 82a-82n. In various embodiments, the registers 106a-106n may be configured to hold the 2N-bit (e.g., 16-bit or 32-bit) values received from and transferred in the data bus signal DBUS (N bits at a time) and the signals BA to BN (2N bits at a time). Other storage bit widths may be implemented to meet the design criteria of a particular application.

The registers 106a-106n are generally operated independently from the register 104a-104n. The registers 106a-106n may present the buffered bias values to the transceiver channel circuits 82a-82n in both the transmit mode and the receive mode. The buffered bias values may be presented independently of which register control signal RA-EN to RN-EN is active or inactive.

The phase values, the gain values and the bias values may be written into and read from the registers 104a-104n and 106a-106n by the SPI core circuit 84 several (e.g., 8 or 16) bits at a time. The write data and/or read data may be transferred between the SPI core circuit 84 and the registers 104a-104n and 106a-106n in the data bus signal DBUS. The write/read direction may be based on the signal W/R.

The write data values may be received by the SPI core circuit 84 via the serial input signal SIN from the controller 70 and the gain/phase table 72. While the signal W/R is in the write state (or mode), the write data values may be presented from the SPI core circuit 84 via the data bus signal DBUS to the registers 104a-104n and 106a-106n. The write data values may be subsequently stored in the registers 104a-104n and 106a-106n.

While the signal W/R is in the read state (or mode), read data values may be read from the registers 104a-104n and 106a-106n. The read data value may be transferred from the registers 104a-104n and 106a-106n via the data bus signal DBUS to the SPI core circuit 84. The SPI core circuit 84 may subsequently transfer the read data values to the controller 70 via the serial output signal SOUT.

Figure 4:
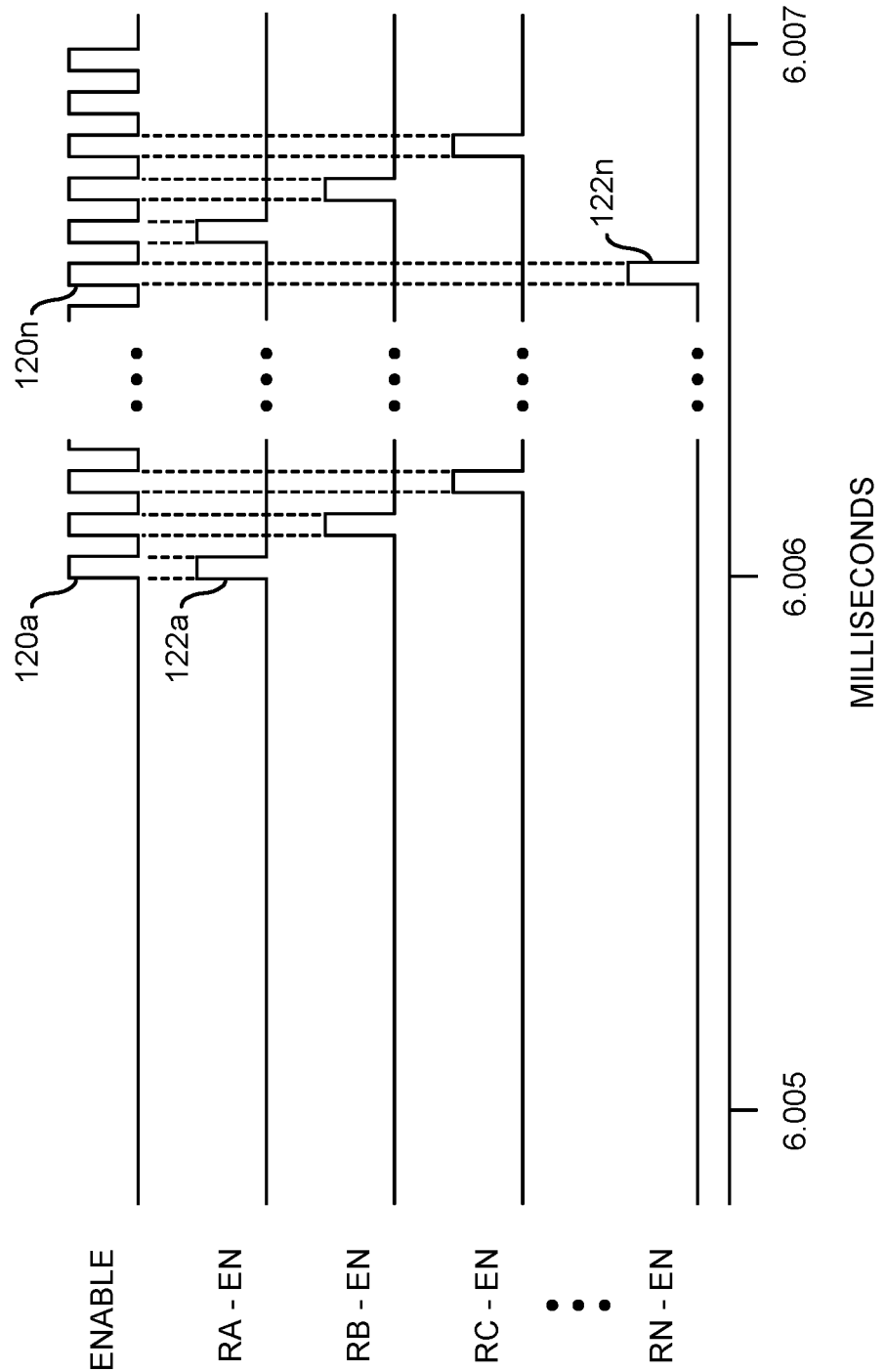
FIG. 4 is a timing diagram of waveforms for an enable signal and multiple control signals.

Referring to FIG. 4, a timing diagram of an example set of waveforms for the signal ENABLE and the register control signals RA-EN to RN-EN is shown. At a transition 120a (e.g., a rising edge), the signal ENABLE may change from the hold state (e.g., a low voltage or a logical zero state) to the transfer state (e.g., a high voltage or a logical one state). After a predetermined dwell time, the signal ENABLE may change back to the hold state. The transition 120a may trigger the fast switching circuit 102 to generate a pulse 122a in the register control signal RA-EN that follows the pulse in the signal ENABLE. The pulse may change the register control signal RA-EN from the inactive state (e.g., a low voltage or a logical zero state) to the active state (e.g., a high voltage or a logical one state) and later back to the inactive state. The other register control signals RB-EN to RN-EN may remain in the inactive state.

At a next transition in the signal ENABLE, the fast switching circuit 102 may generate a pulse in the register control signal RB-EN. The pulses in the register control signals RA-EN and RB-EN generally do not overlap. The other register control signals RA-EN and RC-EN to RN-EN generally remain in the inactive state.

At a next transition in the signal ENABLE, the fast switching circuit 102 may generate a pulse in the register control signal RC-EN. The pulses in the register control signals RB-EN and RC-EN generally do not overlap. The sequence of pulses in the register control signals RA-EN to RN-EN may continue until all of the register control signals RA-EN to RN-EN have been pulsed once.

After a pulse 122n has been generated in the register control signal RN-EN in response to an Nth transition 120n in the signal ENABLE, the fast switching circuit 102 may wrap around to align the register control signal RA-EN with the signal ENABLE. At the next transition in the signal ENABLE, the fast switching circuit 102 may generate another pulse in the register control signal RA-EN.

Figure 5:
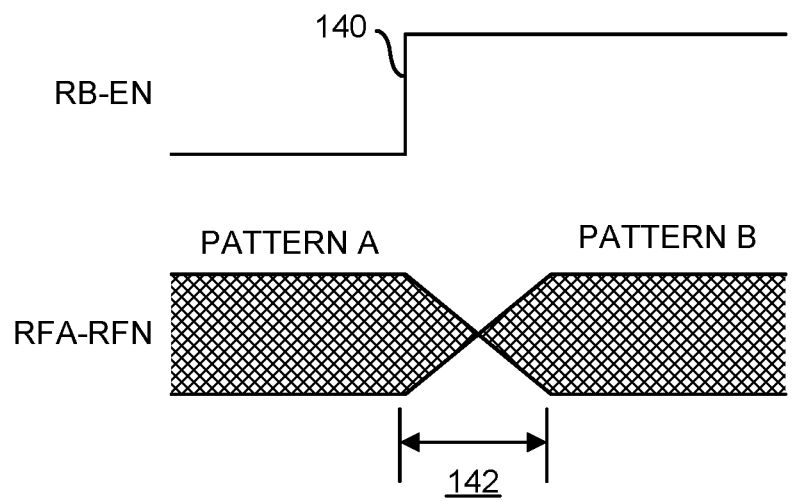
FIG. 5 is a timing diagram of waveforms for a register control signal and a radio frequency signal.

Referring to FIG. 5, a timing diagram of an example set of waveforms for the register control signal RB-EN and the radio frequency signals RFA to RFN is shown. The RF transceiver system 60 may be generating a beam shape and direction (e.g., PATTERN A) using the radio frequency signals RFA to RFN. At a transition 140, the register control signal RB-EN may change from the inactive state (e.g., a low voltage of a logical zero state) to the active state (e.g., a high voltage or a logical one state). The transition 140 may trigger the corresponding subset of registers 104a-104n to present a different gain value and/or a different phase value to the transceiver channel circuits 82a-82n. Loading of the different gain values and the different phase values into the transceiver channel circuits 82a-82n may cause a change in the beam shape/direction from PATTERN A to another shape/direction (e.g., PATTERN B). The change in the radio frequency signals RFA to RFN may take place over a short period 142. In various embodiments, the period 142 may be less than 30 nanoseconds. Other periods may be implemented to meet the design criteria of a particular application.

Figure 6:
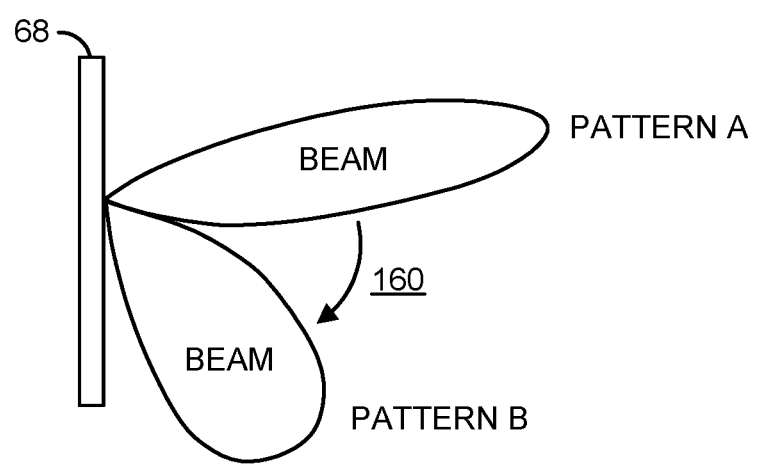
FIG. 6 is a diagram of a set of beam patterns extending from an antenna array of the system of FIG. 1.

Referring to FIG. 6, a diagram of an example set of beam shapes extending from the antenna array 68 is shown. The RF transceiver system 60 may be initially generating the PATTERN A for the BEAM (corresponding to the condition prior to the transition 140 in FIG. 5). At the transition 140, the new set of gain values and phase values may be loaded from the access circuit 100 into the transceiver circuits 82a-82n. In response, the RF transceiver system 60 may generate the PATTERN B for the field BEAM (corresponding to the condition after the transition 140 in FIG. 5). The new gain values and the new phase values may cause one or more geometric and/or spatial changes in the field BEAM. For example, the radio frequency beam weight (or amplitude) of the field BEAM may shorten from the PATTERN A to the PATTERN B. In another example, a radio frequency beam width (or spread) of the field BEAM may expand from the PATTERN A to the PATTERN B. The spatial direction of the main lobe of field BEAM may shift 160 from the PATTERN A to the PATTERN B. In various situations, the spatial shift 160 may be a planer shift within a two-dimensional plane (e.g., a horizontal plane). In other situations, the spatial shift 160 may be in a three-dimensional space (e.g., both horizontal and vertical). Furthermore, the number of lobes may change from the PATTERN A to the PATTERN B.

Figure 7:
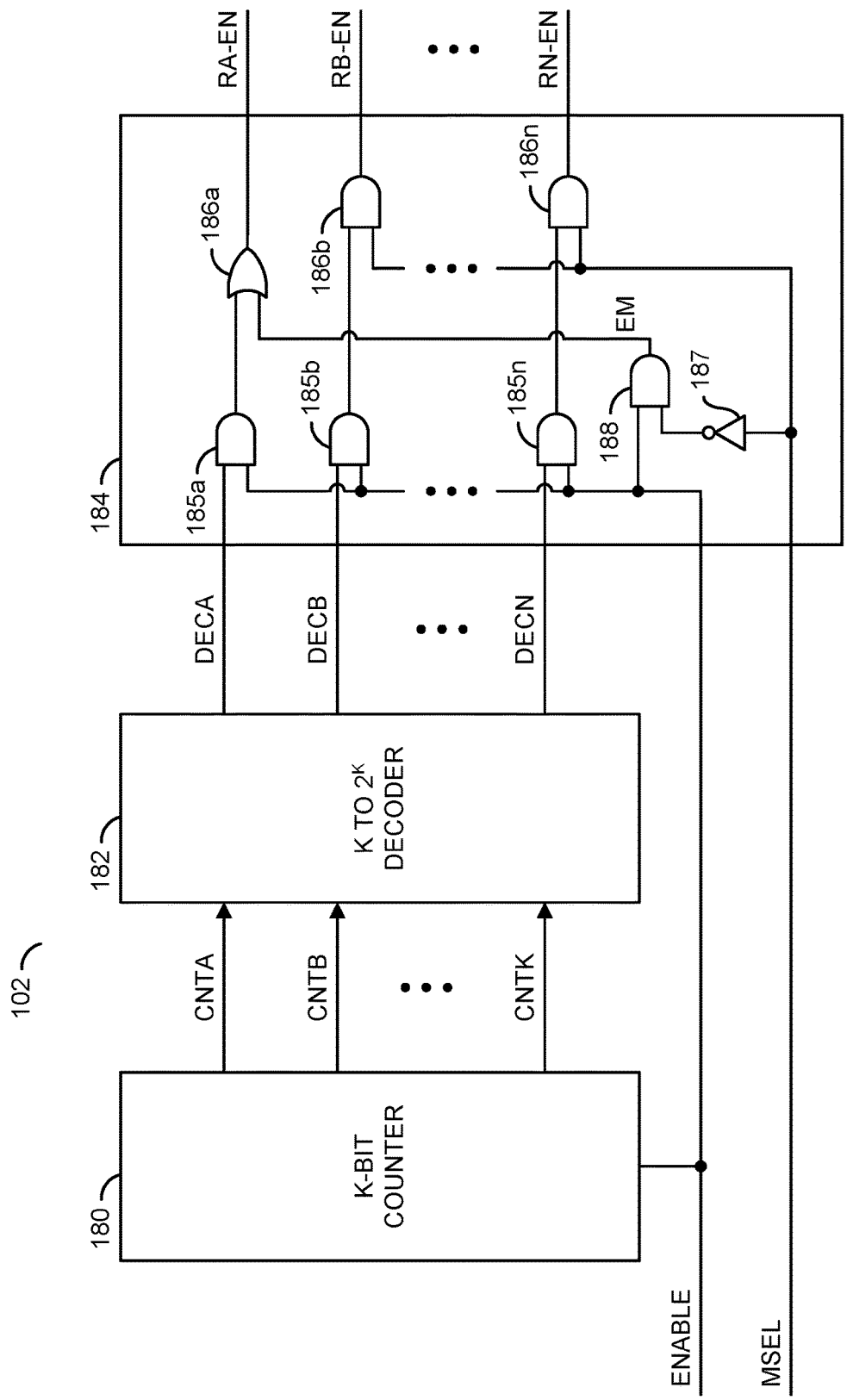
FIG. 7 is a block diagram of a fast switching circuit of FIG. 3 in an accordance with an embodiment of the invention.

Referring to FIG. 7, a block diagram illustrating an example implementation of the fast switching circuit 102 is shown in an accordance with an embodiment of the invention. The fast switching circuit 102 generally comprises a block (or circuit) 180, a block (or circuit) 182 and a block (or circuit) 184. The circuit 184 generally comprises multiple blocks (or circuits) 185a-185n, multiple blocks (or circuits) 186a-186n, a block (or circuit) 187 and a block (or circuit) 188. The circuits 180-188 may be implemented with hardware, a combination of hardware and software and/or simulated with software.

The signal ENABLE may be received by the circuit 180, the circuits 185a-185n and the circuit 188. The signal MSEL may be received by the circuits 186b-186n and the circuit 187. The circuits 186a-186n may generate the signals RA-EN to RN-EN.

Multiple signals (e.g., CNTA to CNTK) may be generated by the circuit 180 and received by the circuit 182. Each signal CNTA to CNTK may convey a binary value that collectively forms a count value. Multiple signals (e.g., DECA to DECN) may be generated by the circuit 182 and received by the circuits 185a-185n. Each signal DECA to DECN may carry a binary value that collectively forms a decoded value. A signal (e.g., EM) may be generated by the circuit 188 and received by the circuit 186a. The signal EM may be a Boolean AND of the signal ENABLE and an inverse of the signal MSEL.

The circuit 180 may implement a K-bit counter circuit. The K-bit counter circuit 180 is generally operational to count a number of transitions in the signal ENABLE. The number of transitions may be presented as the count value in the signals CNTA to CNTK (e.g., from zero to $2^K-1$). Upon reaching the highest count value (e.g., $2^K-1$), the K-bit counter circuit 180 may wrap around to the lowest count value (e.g., zero). The value of $2^K$ generally matches the number of subsets (or layers) implemented in the registers 104a-104n. In various embodiments, the value of K may be two (four subsets of the registers 104a-104n) and the K-bit counter circuit 180 counts a binary sequence of 00, 01, 10, 11, 00, 01, etc. In other embodiments, the value of K may be seven, corresponding to 128 subsets. Other values of K may be implemented to meet the design criteria of a particular application. In some embodiments, the K-bit counter circuit 180 may be implemented with a series of J-K flip-flops wired to update on each transition of the signal ENABLE from the transfer state to the hold state (e.g., each falling edge). Other types of flip-flops and/or other transitions may be used to meet the design criteria of a particular application.

The circuit 182 may implement a K to $2^K$ decoder circuit (or decoder circuit for short). The decoder circuit 182 is generally operational to decode the count value received from the K-bit counter circuit 180 into a currently active decoded signal DECA to DECN. The decoding generally causes one of the signals DECA to DECN to be active at a time, while the remaining signals DECA to DECN may be inactive. By way of example, where the value of K is two, the signals DECA to DECD may be decoded in accordance with Table I as follows:

TABLE I

| CNTA | CNTB | DECA | DECB | DECC | DECD |
|------|------|------|------|------|------|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

The circuit 184 may implement a logic circuit. The logic circuit 184 generally comprises an input row of the circuits (or logic gates) 185-185n, an output row of the circuit (or logic gates) 186a-186n, the circuit (or logic gate) 187 and the circuit (or logic gate) 188. The signals DECA to DECN may be received at an input port of each corresponding logic gate 185a-185n. An output port of each corresponding logic gate 185a-185n may be directly connected to an input port of the logic gates 186a-186n. The signal ENABLE may be received at another input port of each corresponding logic gate 185a-185n, each logic gate 186b-186n, the logic gate 187 and the logic gate 188. The logic gate 188 may receive the output generated by the logic gate 187. The signal EM may be generated by the logic gate 188 and received at another input port of the logic gate 186a. The signals RA-EN to RN-EN may be presented from an output port of each corresponding logic gate 186a-186n.

Each logic gate 185a-185n may implement a logical AND gate. The logical AND gates 185a-185n are generally operational to pass the signal ENABLE to the logic gates 186a-186n while the signal ENABLE has a high level (e.g., a high voltage or a logical one state). Each logical AND gate 185a-185n may present a low level (e.g., a low voltage or a logical zero state) while the signal ENABLE has the low level.

The logic gate 186a may implement a logical OR gate. The logical OR gate 186a may be operational to generate the signal RA-EN by a Boolean OR of the output of the logical AND gate 185a and the signal EM. Each logic gate 186b-186n may implement a logical AND gate. The logical AND gates 186b-186n may be operational to generate the signals RB-EN to RN-EN by a Boolean AND of the outputs of the logical AND gates 185b-185n and the signal ENABLE.

The logic gate 187 may implement an inverter gate. The inverter gate 187 is generally operational to invert the signal ENABLE and present the inverted value to an input port of the logic gate 188.

The logic gate 188 may implement a logical AND gate. The logical AND gate 188 is generally operational to generate the signal EM by a Boolean AND of the signal MSEL and the inverse value of the signal ENABLE.

A total delay through the circuits 180, 182 and 184 is generally less than half a period of the signal ENABLE. When the signal ENABLE transitions to the hold state, the K-bit counter circuit 180 may update the count value in the signal CNTA to CNTK and the decoder circuit 182 may propagate the newly decoded binary value to the signal DECA to DECN. While the signal MSEL is in the enabled state (e.g., a high voltage or a logical one state), the logic circuit 184 may generate the signals RA-EN to RN-EN to follow the signals DECA to DECN with a current one of the signals RA-EN to RN-EN also synchronized to the signal ENABLE by the logical AND gates 185a-185n. While the signal MSEL is in the disabled state (e.g., a low voltage or a logical zero state), the logic circuit 184 may force each signal RB-EN to RN-EN into the deasserted state by the logical AND gates 186b-186n, and the signal RA-EN is synchronized to the signal ENABLE by the logical OR gate 186a.

Figure 8:
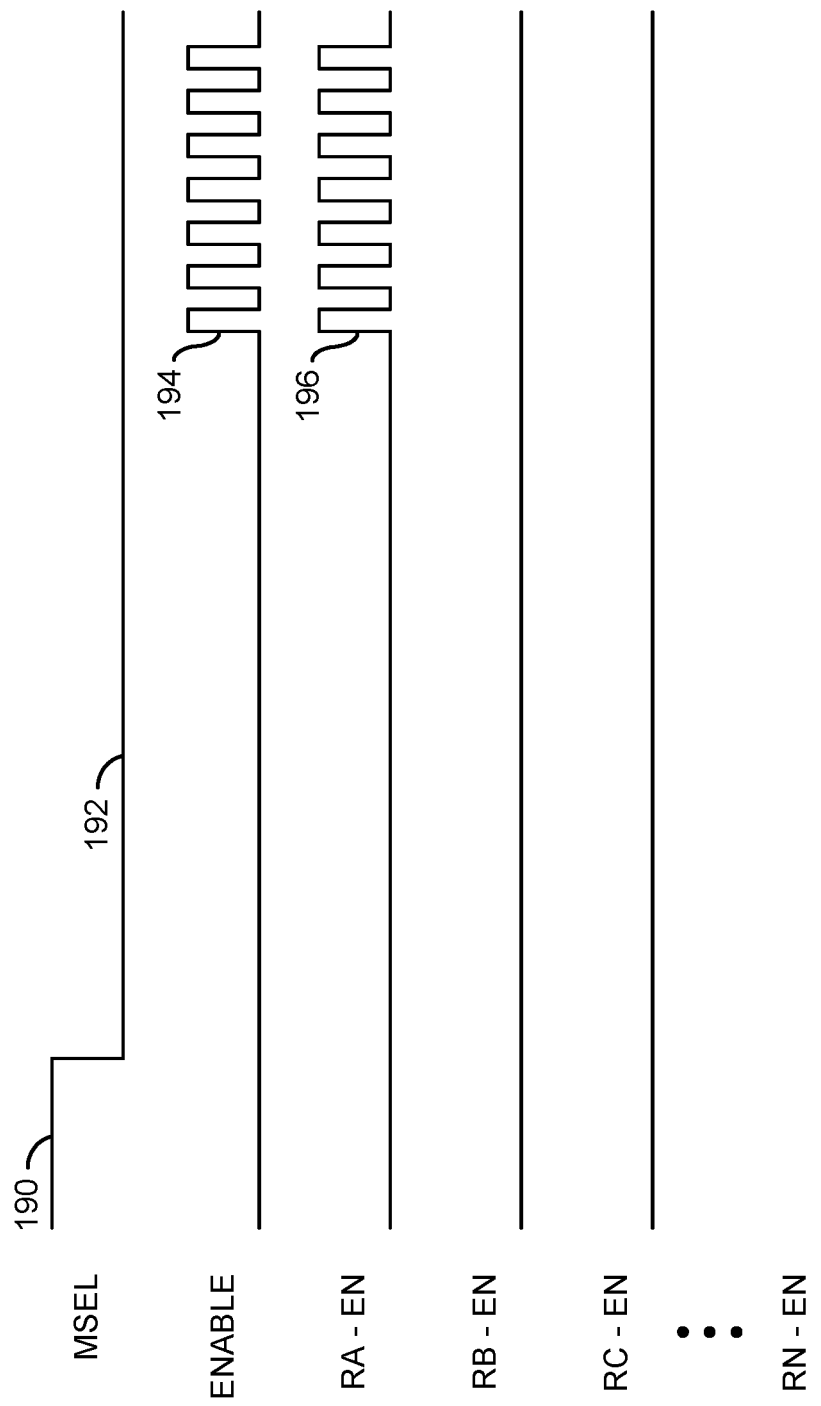
FIG. 8 is a timing diagram of waveforms related to a mode select.

Referring to FIG. 8, a timing diagram of an example set of waveforms related to the mode select signal MSEL is shown. While the mode select signal MSEL is in the enabled state 190, the fast switching circuit 102 may generate the register control signals RA-EN to RN-EN such that one is synchronized with the signal ENABLE and the remaining are deasserted. As such, the system 60 may shift from one set of phase gain values at a time per each transition of the signal ENABLE from the hold state to the transfer state.

While the mode select signal MSEL is in the disabled state 192, the fast switching circuit 102 may generate the register control signal RA-EN to follow the signal ENABLE. For example, for each set of pulses 194 in the signal ENABLE, the fast switching circuit 102 may generate a similar set of pulses 196 in the register control signal RA-EN. The register control signals RB-EN to RN-EN may remain in the disabled state (e.g., a low voltage as illustrated).

Figure 9:
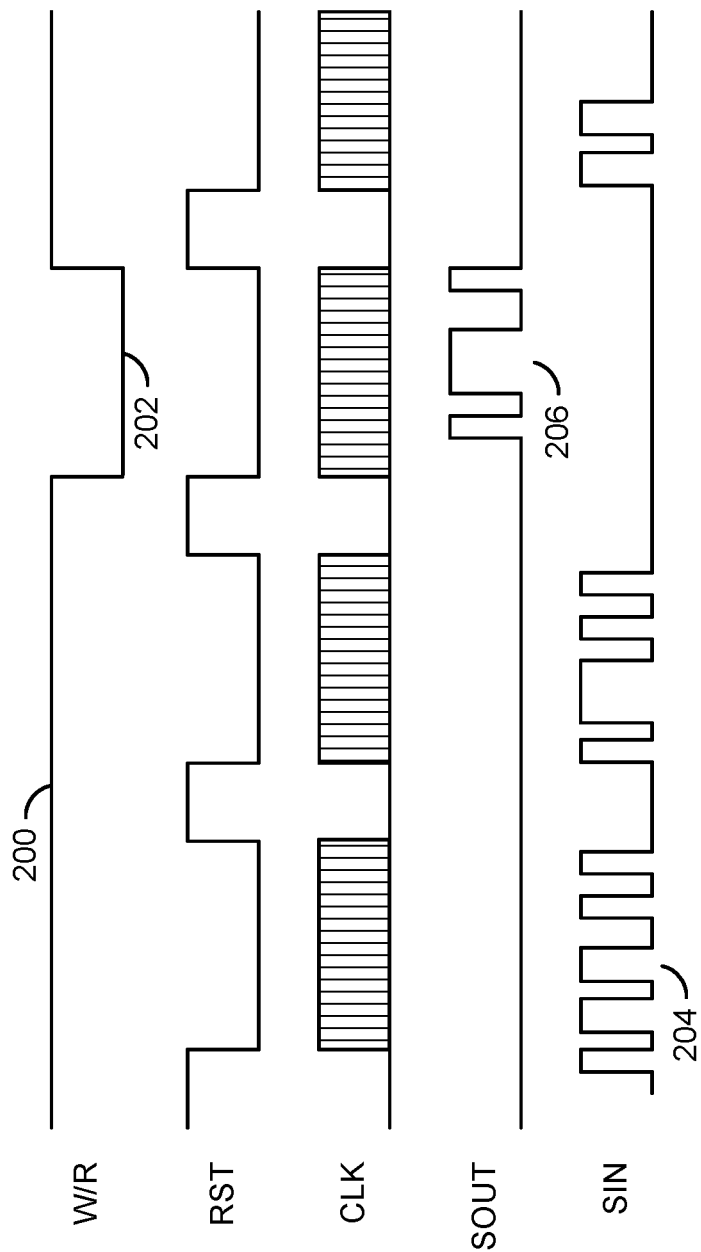
FIG. 9 is a timing diagram of waveforms related to reading and writing register values.

Referring to FIG. 9, a timing diagram of an example set of waveforms related to reading and writing is shown. The signal W/R may have a write state (e.g., a high voltage or a logical one state) 200 and a read state (e.g., a low voltage or a logical zero state) 202. Before each read and each write, the reset signal RST may be cycled from a running state (e.g., a low voltage or a logical zero state) through a reset state (e.g., a high voltage or a logical one state) and back to the running state to reset the SPI core circuit 84 in preparation for a subsequent data transfer.

While the signal W/R is in the write state, the beam former circuit 66 may be operational to receive new data values from the controller 70 and write the new data values into the registers 104a-104n and the registers 106a-106n. For example, while the reset signal RST is in the running state, new data values 204 may be transferred from the controller 70 to the SPI core circuit 84 through the serial input signal SIN synchronized to the clock signal CLK. The new data values 204 may subsequently be written into one or more of the registers 104a-104n and 106a-106n via the data bus signal DBUS.

While the signal W/R is in the read state, the beam former circuit 66 may be operational to read the data values from one or more of the registers 104a-104n and the registers 106a-106n and present the read values to the controller 70. For example, while the reset signal RST is in the running state, read data values 206 may be transferred from the registers 104a-104n and 106a-106n to the SPI core circuit 84 through the data bus signal DBUS. The SPI core circuit 84 may transfer the read data values 206 to the controller 70 through the serial output signal SOUT synchronized to the clock signal CLK. The new data values 204 may subsequently be written into the registers 104a-104n and 106a-106n via the data bus signal DBUS.

Although embodiments of the invention have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The functions and structures illustrated in the diagrams of FIGS. 1 to 9 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a switching circuit configured to generate a sequence of pulses in a plurality of control signals in response to a plurality of cycles of an enable signal, wherein a single one of said pulses is generated in a single one of said control signals at a time during each of said cycles of said enable signal; and
a plurality of registers hardwired as a plurality of subsets, wherein (i) each of said subsets of said registers is configured to (a) buffer a plurality of setting values received from a memory and (b) present said setting values from said registers to a plurality of transceiver circuits while a corresponding one of said control signals is in an active state, and (ii) said transceiver circuits are updated with said setting values from said registers within a predetermined time.

2. The apparatus according to claim 1, wherein said predetermined time (i) starts when said corresponding control signal transitions to said active state, continues through transfer of said setting values from said registers to said transceiver circuits and ends when said transceiver circuits update said setting values to steer a radio frequency beam generated by said transceiver circuits and (ii) is no greater than 30 nanoseconds.

3. The apparatus according to claim 1, further comprising a plurality of additional registers configured to (i) buffer a plurality of bias values and (ii) present said bias values to said transceiver circuits, wherein said bias values trim said transceiver circuits without steering a radio frequency beam generated by said transceiver circuits.

4. The apparatus according to claim 1, wherein (i) each of said registers has an output port hardwired directly to a corresponding input port of said transceiver circuits and (ii) said output ports of said registers are in a high-impedance state while said corresponding control signal is in an inactive state.

5. The apparatus according to claim 1, wherein said setting values are moved from a single active one of said subsets of said registers to all of said transceiver circuits in parallel.

6. The apparatus according to claim 1, wherein a radio frequency beam generated by said transceiver circuits has a frequency in a range of 24 gigahertz to 44 gigahertz.

7. The apparatus according to claim 1, wherein said switching circuit, said registers and said transceiver circuits are configured to form part of a fifth generation wireless communications system.

8. The apparatus according to claim 1, wherein said subsets of said setting values correspond to a plurality of patterns of a radio frequency beam generated by said transceiver circuits.

9. The apparatus according to claim 1, wherein said switching circuit comprises:
a counter configured to generate a count value by counting said cycles of said enable signal;
a decoder configured to generate a plurality of decode signals by decoding said count value, wherein a single one of said decode signals is active at a time; and
a logic circuit configured to generate said control signals by gating said enable signal with said decode signals.

10. A method for fast memory access control, comprising the steps of:
buffering a plurality of setting values received from a memory in a plurality of registers hardwired as a plurality of subsets;
generating a sequence of pulses in a plurality of control signals in response to a plurality of cycles of an enable signal_, wherein a single one of said pulses is generated in a single one of said control signals at a time during each of said cycles of said enable signal; and
presenting said setting values from a single one of said subsets of said registers to a plurality of transceiver circuits while a corresponding one of said control signals is in an active state, wherein said transceiver circuits are updated with said setting values from said registers within a predetermined time.

11. The method according to claim 10, wherein said predetermined time (i) starts when said corresponding control signal transitions to said active state, continues through transfer of said setting values from said registers to said transceiver circuits and ends when said transceiver circuits update said setting values to steer a radio frequency beam generated by said transceiver circuits and (ii) is no greater than 30 nanoseconds.

12. The method according to claim 10, further comprising:
buffering a plurality of bias values in a plurality of additional registers; and
presenting said bias values from said additional registers to said transceiver circuits, wherein said bias values trim said transceiver circuits without steering a radio frequency beam generated by said transceiver circuits.

13. The method according to claim 10, further comprising the step of:
transferring data from output ports of each of said registers directly to corresponding input ports of said transceiver circuits, wherein said output ports of said registers are in a high-impedance state while said corresponding control signal is in an inactive state.

14. The method according to claim 10, further comprising the step of:
moving said setting values from a single active one of said subsets of said registers to all of said transceiver circuits in parallel.

15. The method according to claim 10, wherein a radio frequency beam generated by said transceiver circuits has a frequency in a range of 24 gigahertz to 44 gigahertz.

16. The method according to claim 10, wherein the steps are implemented in a fifth generation wireless communications system.

17. The method according to claim 10, wherein said subsets of said setting values correspond to a plurality of patterns of a radio frequency beam generated by said transceiver circuits.

18. The method according to claim 10, wherein said generation of said control signals comprises the steps of:
generating a count value by counting said cycles of said enable signal;
generating a plurality of decode signals by decoding said count value, wherein a single one of said decode signals is active at a time; and
generating said control signals by gating said enable signal with said decode signals.

19. An apparatus comprising:
a switching circuit configured to generate a sequence of pulses in a plurality of control signals in response to a plurality of cycles of an enable signal;
a plurality of first registers hardwired as a plurality of subsets, wherein (i) each of said subsets of said first registers is configured to (a) buffer a plurality of setting values received from a memory and (b) present said setting values from said registers to a plurality of transceiver circuits while a corresponding one of said control signals is in an active state, and (ii) said transceiver circuits are updated with said setting values from said registers within a predetermined time; and
a plurality of second registers configured to (i) buffer a plurality of bias values and (ii) present said bias values to said transceiver circuits, wherein said bias values trim said transceiver circuits without steering a radio frequency beam generated by said transceiver circuits.

20. The apparatus according to claim 19, wherein said predetermined time (i) starts when said corresponding control signal transitions to said active state, continues through transfer of said setting values from said first registers to said transceiver circuits and ends when said transceiver circuits update said setting values to steer said radio frequency beam generated by said transceiver circuits.

* * * * *